United States Patent
Langer (10) Patent No.: US 8,884,696 B2
(45) Date of Patent: Nov. 11, 2014

(54) CONTROL CIRCUIT AND METHOD FOR CONTROLLING AN OPERATION OF A POWER AMPLIFIER

(71) Applicant: Andreas Langer, Lohhof (DE)

(72) Inventor: Andreas Langer, Lohhof (DE)

(73) Assignee: Intel Mobile Communications GmbH, Neubiberg (DE)

( * ) Notice: Subject to any disclaimer, the term of this patent is extended or adjusted under 35 U.S.C. 154(b) by 89 days.

(21) Appl. No.: 13/651,684

(22) Filed: Oct. 15, 2012

(65) Prior Publication Data

US 2014/0103995 A1  Apr. 17, 2014

(51) Int. Cl.
    *H03G 3/00*  (2006.01)

(52) U.S. Cl.
    USPC ............ 330/127; 330/297; 330/302; 330/296

(58) Field of Classification Search
    USPC .................................. 330/127, 297, 302, 296
    IPC ......................................................... H03G 3/00
    See application file for complete search history.

(56) References Cited

U.S. PATENT DOCUMENTS

| 7,062,236 B2 * | 6/2006 | Midtgaard et al. ............ 455/126 |
| 7,443,244 B2 * | 10/2008 | Hagen ............................ 330/285 |
| 8,598,950 B2 * | 12/2013 | Khesbak ......................... 330/51 |
| 2010/0271119 A1 * | 10/2010 | Karoui et al. .................. 329/345 |
| 2012/0244916 A1 * | 9/2012 | Brown et al. .................. 455/571 |
| 2013/0137384 A1 * | 5/2013 | Desclos et al. ................. 455/78 |

* cited by examiner

*Primary Examiner* — Patricia Nguyen
(74) *Attorney, Agent, or Firm* — Eschweiler & Associates, LLC (57) ABSTRACT

A control circuit and a method for controlling an operation of a power amplifier core are provided. The power amplifier core is switchable between an envelope tracking operation mode and a non-envelope tracking operation mode. The control circuit is configured to provide a control signal for controlling the operation of the power amplifier core or to process an amplified signal received from the power amplifier core in dependence on the operation mode of the power amplifier core.

24 Claims, 5 Drawing Sheets

CONTROL CIRCUIT AND METHOD FOR CONTROLLING AN OPERATION OF A POWER AMPLIFIER

FIELD

A control circuit and a method for controlling an operation of a power amplifier core are provided. The power amplifier core is switchable between an envelope tracking operation mode and a non-envelope tracking operation mode.

BACKGROUND

An efficient way to optimize a power amplifier (PA) current consumption in a wireless system across an entire output power range is the use of a DCDC (DCDC=direct current to direct current) converter which provides a power amplifier supply voltage. Depending on the output power, the output voltage of the DCDC converter is adjusted. The lower the output power is, the lower is the required power amplifier supply voltage. Due to the voltage conversion from the battery voltage down to the lower power amplifier supply voltage, the battery current is reduced. Conventionally, the DCDC converter output voltage is set based on a target power (average power) which is expected in a next slot. This procedure is called average power tracking (APT).

In the future, fast DCDC converters, so called envelope tracking (ET) DCDC converters, will further reduce the battery current. Envelope tracking describes an approach for RF amplifier design in which the power supply voltage applied to the power amplifier is constantly adjusted to ensure that the amplifier is operating at or close to peak efficiency for the given instantaneous output power requirements.

A feature of envelope tracking is that the supply voltage of the power amplifier is not constant. The supply voltage of the power amplifier depends on the instantaneous envelope of the modulated baseband signal or RF (RF=radio frequency) input signal, input into the power amplifier. In a highly simplified description the envelope of the modulated baseband signal is calculated by means of the CORDIC (CORDIC=coordinate rotation digital computer) algorithm, followed by a delay adjustment to compensate for a different delay in the main signal path (RF signal generation path) and envelope path, then the envelope signal is shaped (pre-distorted) and finally digital-to-analog converted. This signal is applied to the envelope tracking DCDC converter (special ultra fast DCDC converter) which generates the variable power amplifier supply voltage.

An envelope tracking capable DCDC converter follows the instantaneous envelope of the RF signal which removes the voltage headroom and further increases the system efficiency (=composite efficiency of the power amplifier and the DCDC converter). It is expected that an envelope tracking capable DCDC converter will reduce the battery current of a LTE (LTE=Long Term Evolution) signal by roughly 20+% at maximum output power relative to a standard DCDC converter which simply follows the average power.

To allow envelope tracking operation and to maximize the efficiency enhancement in an envelope tracking system the power amplifier must be designed in a different way compared to a traditional power amplifier design optimized for average power tracking. This must be done to account for the envelope tracking specific requirements.

SUMMARY

A control circuit and a method for controlling an operation of a power amplifier core are provided. The power amplifier core is switchable between an envelope tracking operation mode and a non-envelope tracking operation mode. The control circuit is configured to provide a control signal for controlling the operation of the power amplifier core or to process an amplified signal received from the power amplifier core based on the operation mode of the power amplifier core.

DETAILED DESCRIPTION

In the following description, equal or equivalent elements or elements with equal or equivalent functionality are denoted in the following description by equal or equivalent reference numerals.

In the present application a coupling between two terminals should be understood as having the capability of a direct low ohmic connection or an indirect connection with one or more elements between, such that a signal at a second node is dependent on a signal at a first node. Between two coupled terminals a further element may be coupled, but not necessarily need to be, such that two terminals which are coupled to each other may be also directly connected to each other (e.g., by means of a low impedance connection, such as a wire, a wire trace, or a conductive channel in a semiconductor device).

Figure 1:
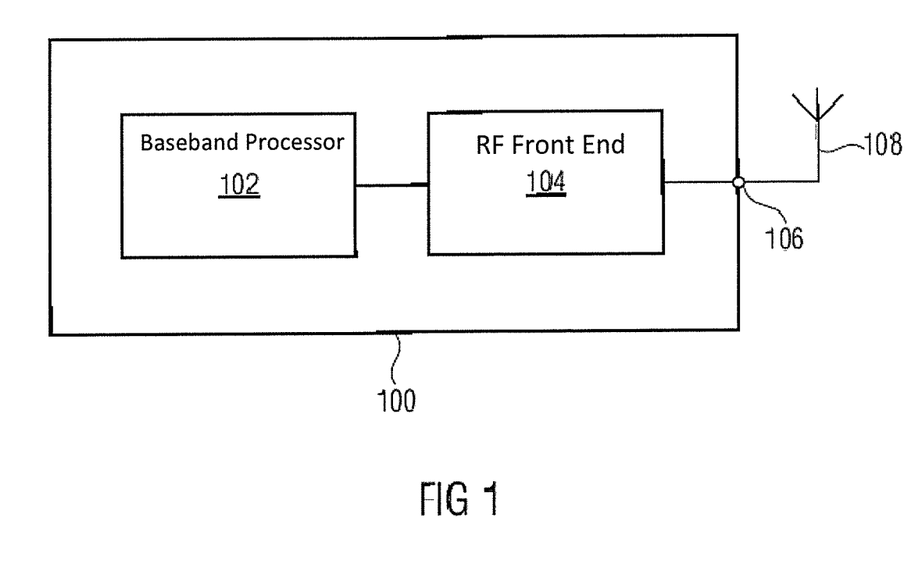
FIG. 1 shows a block diagram of an example mobile communication device.

FIG. 1 shows a block diagram of an example mobile communication device 100 comprising a digital baseband processor 102, an RF front end 104 coupled to the baseband processor 102 and to an antenna port 106. The antenna port 106 is configured to allow connection of an antenna 108 to the mobile communication device 100. The baseband processor 102 generates signals to be transmitted via the antenna 108 which are forwarded to the RF front end 104 generating a transmit signal output to the antenna port 106 for transmission via the antenna 108. The RF front end 104 may also receive signals via the antenna port 106 from the antenna 108 and provides respective signals to the baseband processor 102 for processing the received signals. The control circuit and the method described in further detail below may be implemented in the RF front end 104, for example, in a power amplifier or amplifier circuit which may provide the transmit signal output to the antenna port 106.

The mobile communication device 100 may be a portable mobile communication device and may be configured to perform a voice and/or data communication according to a mobile communication standard with other communication devices, like other mobile communication devices or base stations of a mobile communication network. Mobile communication devices may comprise a mobile handset, such as a mobile phone or a smart phone, a tablet PC, a broadband modem, a laptop, a notebook, a router, a switch, a repeater or a PC. Also, the mobile communication device 100 may be a base station of a communication network.

Figure 2A:
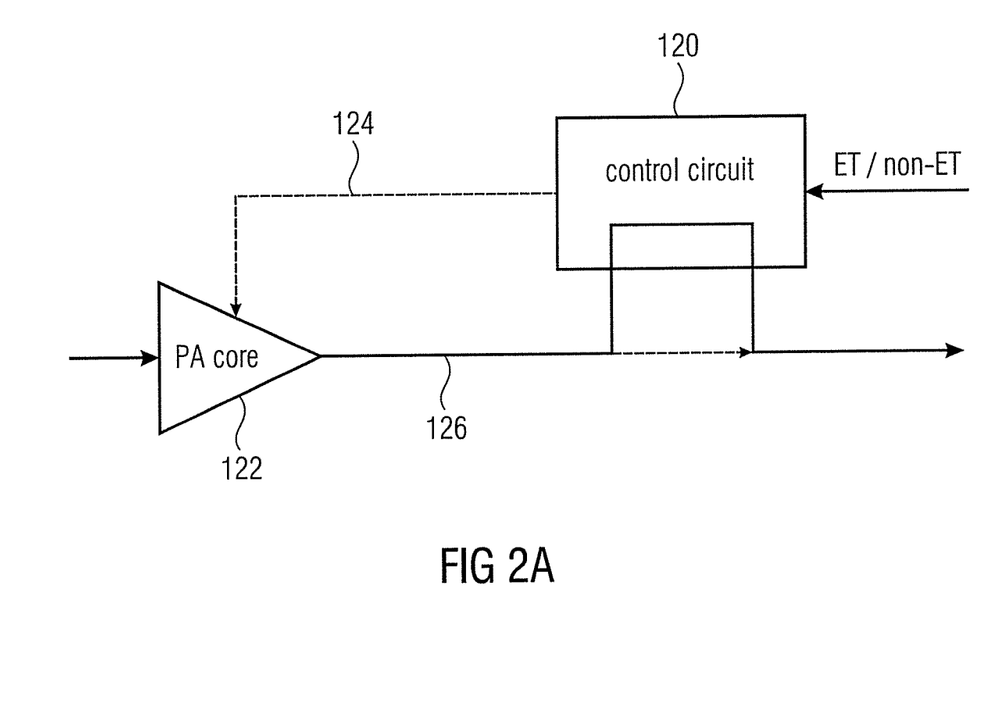
FIG. 2A shows a block diagram of a control circuit for controlling an operation of a power amplifier core switchable between an envelope tracking operation mode and a non-envelope tracking operation mode.

FIG. 2A shows a block diagram of a control circuit 120 for controlling an operation of a power amplifier core 122 switchable between an envelope tracking operation mode and a non-envelope tracking operation mode. The control circuit 120 is configured to provide a control signal 124 for controlling the operation of the power amplifier core 122 or to process an amplified signal 126 received from the power amplifier core 122 based on the operation mode of the power amplifier core 122.

Figure 2B:
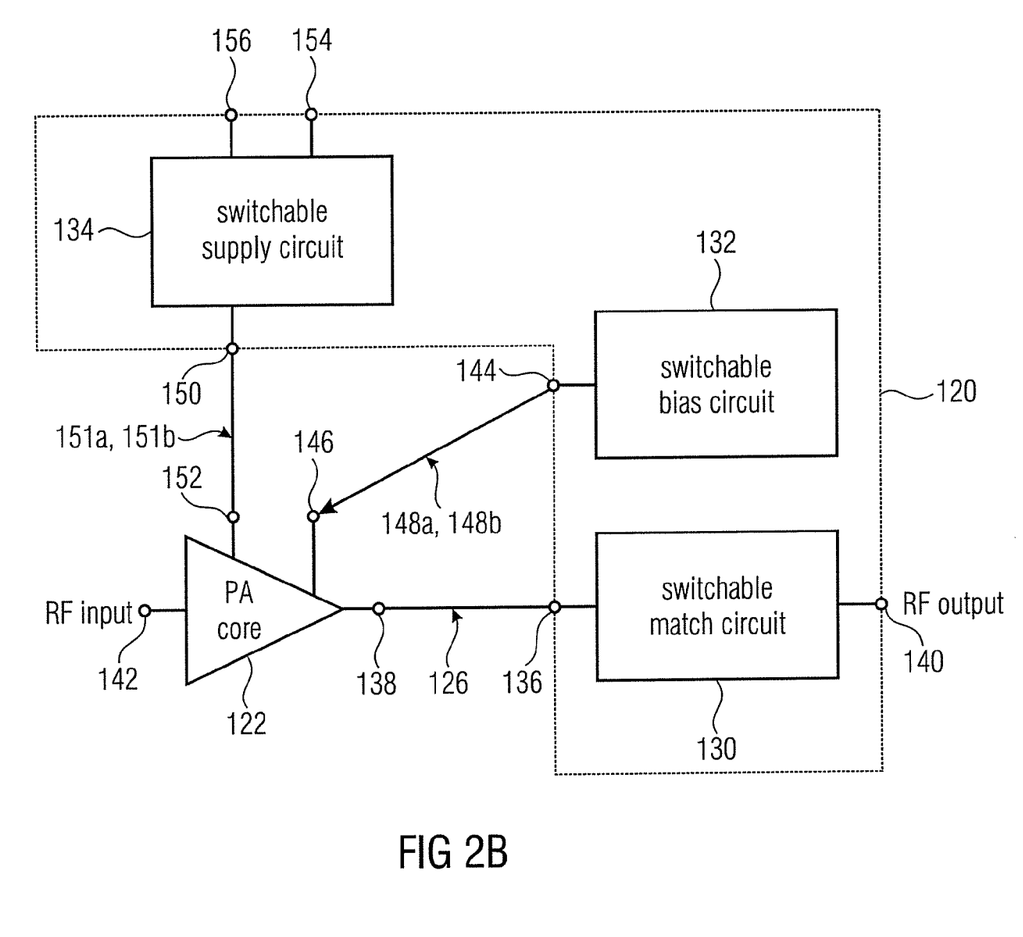
FIG. 2B shows a block diagram of the control circuit, wherein the control circuit comprises at least one of a switchable match circuit, a switchable bias circuit and a switchable supply circuit.

FIG. 2B shows a block diagram of the control circuit 120 according to one embodiment, wherein the control circuit 120 comprises at least one of a switchable match circuit 130, a switchable bias circuit 132 and a switchable supply circuit 134.

The switchable match circuit 130 may comprise an input 136 configured to couple to an output 138 of the power amplifier core 122, to receive the amplified signal 126 from the power amplifier core 122. The switchable match circuit 130 in one embodiment is configured to provide for the amplified signal 126 a first load impedance in response to the envelope tracking operation mode and a second load impedance, different from the first load impedance, in response to the non-envelope tracking operation mode.

In other words, the switchable match circuit 130 is configured to process the amplified signal 126 received from the power amplifier core 122 by providing for the amplified signal 126 the first load impedance in response to the envelope tracking operation mode and the second, different load impedance in response to the non-envelope tracking operation mode.

The first load impedance and the second load impedance are adapted to account for the different requirements of the power amplifier core 122 in the envelope tracking operation mode and in the non-envelope tracking operation mode, such that the power amplifier core 122 can be operated in both operation modes, the envelope tracking operation mode and the non-envelope tracking operation mode, without major drawbacks in one of the two modes.

For example, a power amplifier designed for envelope tracking operation (envelope tracking power amplifier) may require a higher load impedance than a power amplifier designed for non-envelope tracking operation (non-envelope tracking power amplifier). If an envelope tracking power amplifier is operated in a non-envelope tracking operation mode, the higher load impedance would lead to a loss in performance in the non-envelope tracking operation mode when compared to a non-envelope tracking power amplifier. In order to compensate for this loss, a DCDC converter with boost capabilities is required.

Therefore, the first load impedance is adapted in one embodiment to increase a peak efficiency of the power amplifier core 122 in the envelope tracking operation mode, wherein the second load impedance is adapted to increase a maximum power output of the power amplifier core 122 in the non-envelope tracking operation mode while the DCDC converter still can be operated in the buck mode. Thereby, the first load impedance is greater than the second load impedance in one embodiment.

As shown in FIG. 2B, the switchable match circuit 130 comprises an output 140 for providing the matched (or processed) amplified signal, or in other words, a matched (or processed) version of the amplified signal 126. The output 140 of the switchable match circuit 122 can be a RF output 140. The RF output 140 can be coupled or connected, for example, to the antenna 108 (see FIG. 1).

Moreover, the power amplifier core 122 may comprise an input 142 for a signal to be amplified by the power amplifier core 122. The input 142 of the power amplifier core 122 can be a RF input 142.

The switchable bias circuit 132 may comprise a bias output 144 configured to be coupled to a control input 146 of the power amplifier core 122. The switchable bias circuit 132 is configured to provide at the bias output 144 a first bias signal 148a in response to the envelope tracking operation mode and a second bias signal 148b, different from the first bias signal 148a, in response to the non-envelope tracking operation mode.

The first bias signal 148a and the second bias signal 148b are adapted to optimize a quiescent current of the power amplifier core 122 in the respective operation mode according to one embodiment.

For example, the first bias signal 148a is adapted to increase the quiescent current of the power amplifier core 122 in the envelope tracking operation mode (compared to the non-envelope tracking operation mode).

The second bias signal 148b is adapted to reduce the quiescent current of the power amplifier core 122 in the non-envelope tracking operation mode (compared to the envelope tracking operation mode).

In other words, the first bias signal 148a is adapted to set the quiescent current of the power amplifier core 122 to a first strength, wherein the second bias signal 148b is adapted to set the quiescent current of the power amplifier core 122 to a second strength, different from the first strength, e.g., smaller than the first strength.

The switchable supply circuit 134 may comprise a power amplifier supply terminal 150 configured to be coupled to a supply input 152 of the power amplifier core 122. The switchable supply circuit 134 is configured to provide at the power amplifier supply terminal 150 a first decoupling capacitance for decoupling an envelope tracking supply signal 151a received from a DCDC converter in response to the envelope tracking operation mode, and provide a second decoupling capacitance, different from the first decoupling capacitance, for decoupling a non-envelope tracking supply signal 151b received from the DCDC converter in response to the non-envelope tracking operation mode.

The first decoupling capacitance and the second decoupling capacitance are adapted to account for the different decoupling requirements of the supply signal (e.g., a supply voltage or supply current) of the power amplifier core 122 in the envelope tracking operation mode and in the non-envelope tracking operation mode according to one embodiment.

For example, the first decoupling capacitance can be smaller than the second decoupling capacitance.

As shown in FIG. 2B, the switchable supply circuit 134 may comprise a capacitor terminal 154 configured to be coupled to at least one decoupling capacitor. The switchable supply circuit 134 is configured to couple the power amplifier supply terminal 150 and the capacitor terminal 154 in response to the non-envelope tracking operation mode, and decouple the supply terminal 150 and the capacitor terminal 154 in response to the envelope tracking operation mode.

Moreover, the switchable supply circuit 134 may comprise a DCDC converter supply terminal 156 configured to be coupled to the DCDC converter which provides the envelope tracking supply signal 151a (e.g., an envelope tracking supply voltage) in response to the envelope tracking operation mode and the non-envelope tracking supply signal 151b (e.g., a non-envelope tracking supply voltage) in response to the non-envelope tracking operation mode.

The DCDC converter supply terminal 156 and the power amplifier supply terminal 150 can be coupled or connected to each other. Naturally, the power amplifier supply terminal 150 can also be directly coupled or connected to the DCDC converter without requiring the DCDC converter supply terminal 156.

Referring to FIGS. 2A and 2B, the control signal 124 for controlling the operation of the power amplifier core 122 can include the first and second bias signals 148a and 148b. Moreover, the control signal 124 for controlling the operation of the power amplifier core 122 can include the envelope tracking and non-envelope tracking supply signals 151a and 151b.

As already mentioned, to allow envelope tracking operation and maximize the efficiency enhancement in an envelope tracking system, the power amplifier is designed in a different way compared to a traditional power amplifier design optimized for average power tracking. This is done to account for the envelope tracking specific requirements. One potential change compared to a standard, non-envelope tracking capable power amplifier is a higher load impedance which basically means that the power amplifier achieves the target output power at a higher power amplifier supply voltage; typically >3.4 to 3.8V are required. This high impedance load line design helps to improve the peak efficiency of the power amplifier. The disadvantage of this high impedance load-line design is that for non-envelope tracking operation (e.g., in APT mode) the DCDC converter must support a boost mode to achieve the maximum output power. The mandatory boost mode support for non-envelope tracking operation results in a more expensive implementation of the DCDC converter compared to a pure buck mode. Sometimes, depending on the converter efficiency, the boost mode capability in the non-envelope tracking mode also reduces the efficiency of the converter in the envelope tracking mode.

Other design changes are related to power amplifier biasing and are driven by the important envelope tracking requirement to flatten the AMPM- and AMAM phase response of the power amplifier vs. the power amplifier supply voltage (in this context power amplifier supply voltage means the voltage which is influenced by the envelope tracking operation, e.g., the supply voltage of a 2nd power amplifier stage) and across output power. To meet the stringent AMAM response, sometimes the power amplifier quiescent current is set to higher values than usual in non-envelope tracking operation or the bias ratio between the power amplifier stages is changed. As a result, the power amplifier current goes up in the non-envelope tracking operation where the high quiescent current is not needed since AMAM conversion is less critical.

Other power amplifier design changes are related to the decoupling of the power amplifier stages which are intended to operate in the envelope tracking mode. In a traditional non-envelope tracking design, the decoupling capacitors are in a nF range. The decoupling capacitors are needed to guarantee power amplifier stability. A capacitor in the nF range is harmful for the envelope tracking operation, since the bandwidth of the envelope tracking DCDC converter is corrupted. Thus, the decoupling capacitors must be reduced to typical a few 100 pF in order to enable envelope tracking operation with high bandwidth. During the envelope tracking operation the low output impedance of the DCDC converter, which is effective over a large bandwidth (typical 20 to 100 MHz), takes over the function of the decoupling capacitors allowing a stable power amplifier operation. Depending on the converter design, the power amplifier tends to be unstable in the non-envelope tracking operation since the wideband, low output impedance of the converter is only present in the envelope tracking operation. In this case, special measures are needed in the non-envelope tracking mode to provide the low impedance and guarantee a stable power amplifier operation in the non-envelope tracking mode.

The power amplifier and related methods disclosed herein allow using one power amplifier module for the envelope tracking and non-envelope tracking operation without requesting boost capabilities during the non-envelope tracking operation and/or without degrading the power amplifier performance in the non-envelope tracking operation due to the envelope tracking support capability.

Figure 3:
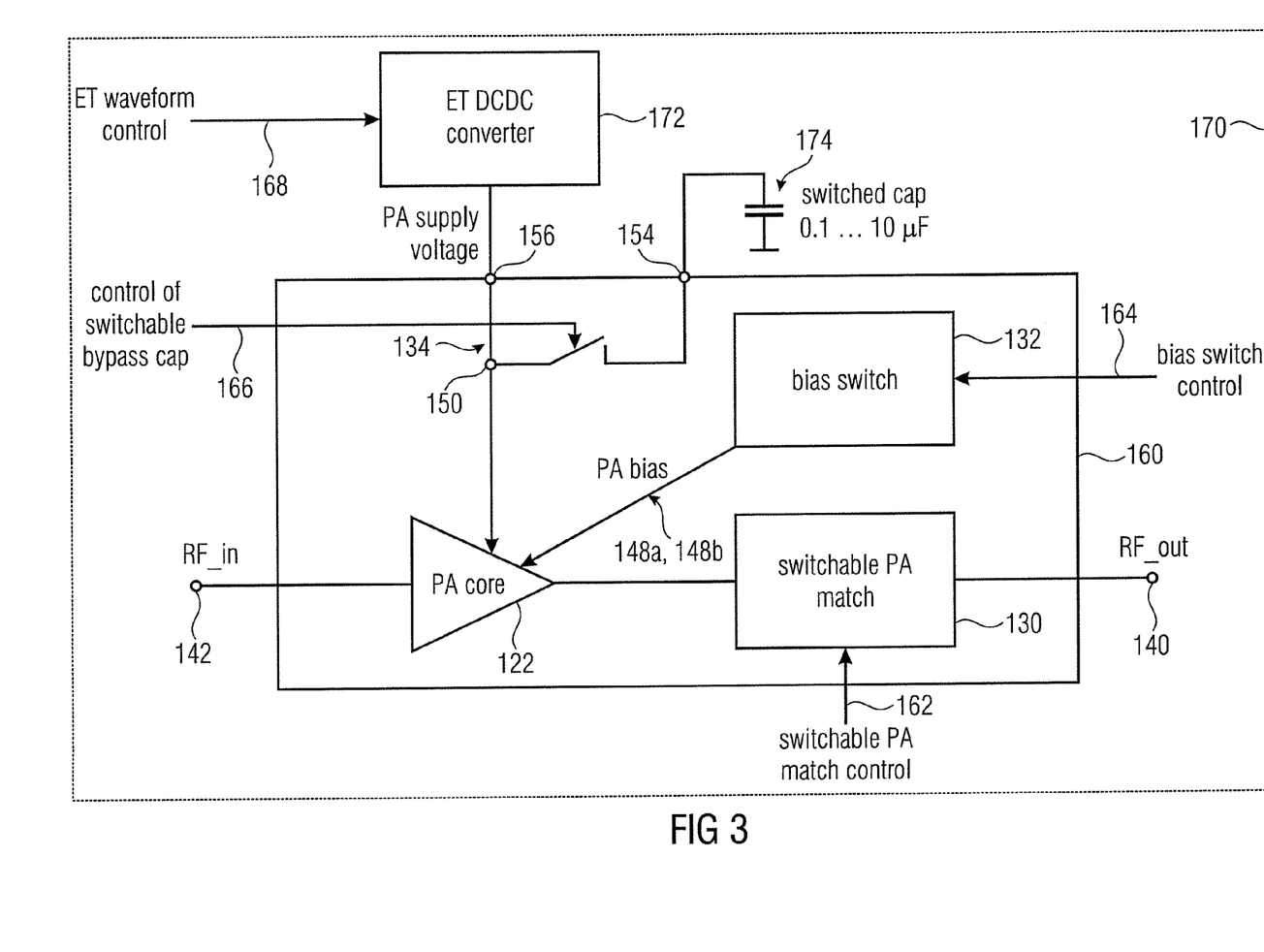
FIG. 3 shows a block diagram of a power amplifier comprising the power amplifier core and the control circuit.

FIG. 3 shows a block diagram of a power amplifier 160 comprising the control circuit 120 and the power amplifier core 122.

The control circuit 120 comprises the switchable match circuit 130 (or switchable PA match) in one embodiment. The switchable match circuit 130 is configured to provide for the power amplifier core 122 the first load impedance in response to the envelope tracking operation mode and the second load impedance, different from the first load impedance, in response to the non-envelope tracking operation mode.

In other words, a first element (of the control circuit 120) is the switchable power amplifier output match 130. As pointed out above, the high impedance load-line is beneficial for the power amplifier peak efficiency and thus helps to improve the composite efficiency of an envelope tracking system. A drawback is that the boost capability of the DCDC converter becomes mandatory if the power amplifier shall operate in the non-envelope tracking operation. The switched output match 130 may comprise at least one state which optimizes the peak efficiency in the envelope tracking mode and at least one state which provides a power amplifier load impedance which is appropriate for a buck only mode of the DCDC converter during the non-envelope tracking operation. The switchable power amplifier matching 130 is mainly effective at a fundamental frequency but might be also used to optimize the impedance at harmonic frequencies in both modes according to one embodiment.

The switchable match circuit 130 comprises a control input for receiving a control signal 162 (switchable PA match control) indicating the current operation mode, i.e., envelope tracking operation mode or non-envelope tracking operation mode in one embodiment.

Furthermore, the control circuit 120 comprises the switchable bias circuit 132 in one embodiment. The switchable bias circuit 132 is configured to provide for the power amplifier core 122 the first bias signal 148a in response to the envelope tracking operation mode and the second bias signal 148b, different from the first bias signal 148a, in response to the non-envelope tracking operation mode.

In other words, a next element (of the control circuit 120) is the bias switch 132 which allows setting the power amplifier quiescent current generation for all power amplifier stages for the envelope tracking and a non-envelope tracking operation. The bias switch 132 comprises at least one state which optimizes the power amplifier quiescent current for the envelope tracking operation, e.g., flattens the AMAM response of the power amplifier, and at least one state which optimizes the power amplifier quiescent current for the non-envelope tracking operation, e.g., minimize power amplifier current for 3G (3G=3rd generation of mobile telecommunications technology) voice signal when operating in APT mode.

The switchable bias circuit 132 also comprises a control input for a control signal 164 (bias switch control) indicating the current operation mode.

Moreover, the control circuit 120 comprises the switchable supply circuit 134 in one embodiment. The switchable supply circuit 134 is configured to provide for the power amplifier core 122 the envelope tracking supply voltage received from the DCDC converter 172 in response to the envelope tracking operation mode, and provide the non-envelope tracking supply voltage received from the DCDC converter 172 in response to the non-envelope tracking operation mode. The switchable supply circuit 134 is configured to provide the first decoupling capacitance for decoupling the envelope tracking supply voltage in response to the envelope tracking operation mode, and provide the second decoupling capacitance, different from the first decoupling capacitance, for decoupling the non-envelope tracking supply voltage in response to the non-envelope tracking operation mode.

As shown in FIG. 3, the switchable supply circuit 134 may comprise the power amplifier supply terminal 150 for providing the envelope tracking supply voltage and the non-envelope tracking supply voltage received from the DCDC converter 172 and the capacitor terminal 154 configured to be coupled to the at least one decoupling capacitor 174, wherein the switchable supply circuit 134 can be configured to couple the power amplifier supply terminal 150 and the capacitor terminal 154 (e.g., by means of a switch) in response to the non-envelope tracking operation mode and to decouple the power amplifier supply terminal 150 and the capacitor terminal 154 (e.g., by means of the switch) in response to the envelope tracking operation mode.

In other words, a third element (of the control circuit 120) is the at least one switchable capacitor 174 in the supply line of the power amplifier stages which operates in the envelope tracking mode. Assuming a 2-stage power amplifier design, during the envelope tracking operation it is possible that both stages operate in the envelope tracking mode (i.e., get the variable power amplifier supply voltage depending on the instantaneous RF input power) or to avoid re-modulation it is sometimes beneficial that only the 2nd stage operates in the envelope tracking mode whereas the 1st stage operates in the APT mode. Independent of whether the 2nd stage only or all stages operate in the envelope tracking mode the switchable capacitor 134 is used to connect a big bypass capacitor 174 in the non-envelope tracking mode (e.g., a few nF or pF) or to disconnect the power amplifier stage from the big bypass capacitor 174 during the envelope tracking operation.

The switchable supply circuit 134 comprises a control input for a control signal 166 (control of switchable bypass cap) indicating the current operation mode in one embodiment.

The related method is that depending on the mode (ET- or non-ET operation) the state of the switchable match 130, bias switch 132 and switchable capacitor 134 is selected.

Thereby, the control signals 162 to 166 for the switchable match circuit 130, the switchable bias circuit 132 and the switchable supply circuit 134 can be provided by an external controller. Naturally, the controller can also be implemented within the power amplifier 160.

As shown in FIG. 3, the power amplifier 160 can be part of a power amplifier circuit 170 comprising the DCDC converter 172. Furthermore, the amplifier circuit 170 can comprise the at least one decoupling capacitance 174.

The DCDC converter 172 can also comprise a control input for a control signal 168 (envelope tracking waveform control) indicating the current operation mode. Observe that the above mentioned controller can also provide the control signal 168 for the DCDC converter 172. Thereby, the amplifier circuit 170 can comprise the controller. Alternatively, the controller can be implemented externally to the amplifier circuit 170.

Figure 4:
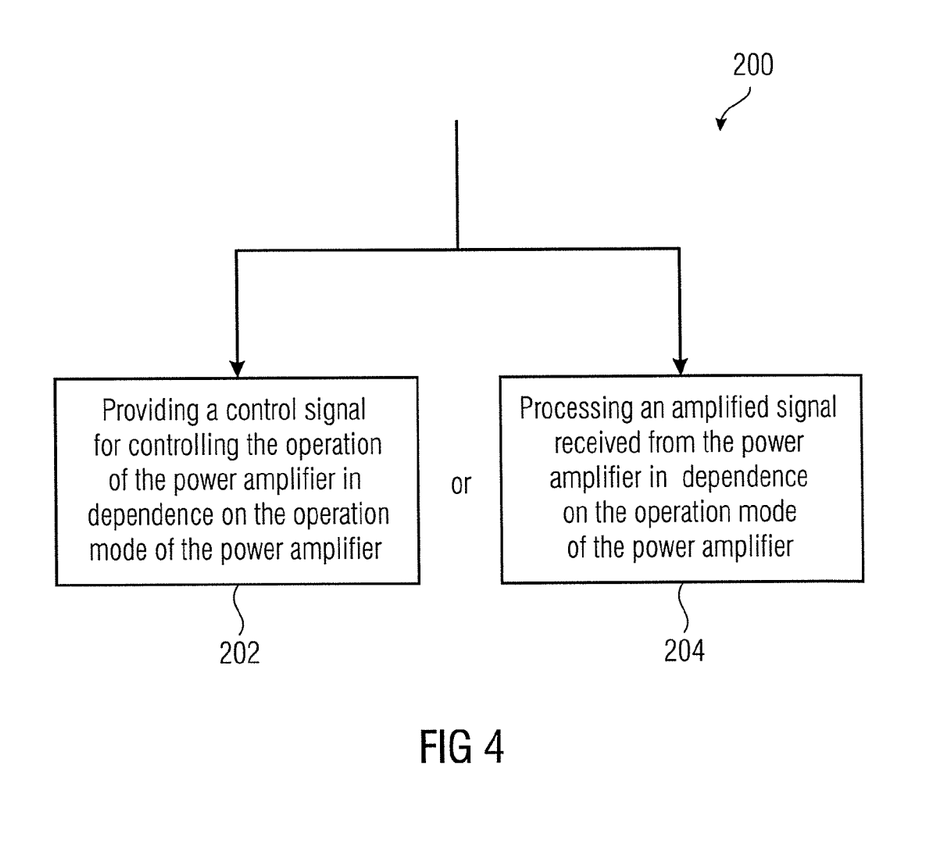
FIG. 4 shows a flowchart of a method for controlling an operation of a power amplifier switchable between an envelope tracking operation mode and a non-envelope tracking operation mode.

FIG. 4 shows a flowchart of a method 200 for controlling an operation of a power amplifier switchable between an envelope tracking operation mode and a non-envelope tracking operation mode. The method 200 comprises providing 202 a control signal for controlling the operation of the power amplifier based on the operation mode of the power amplifier, or processing 204 an amplified signal received from the power amplifier based on the operation mode of the power amplifier.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like a microprocessor, a programmable computer or an electronic circuit. Some one or more of the most important method steps may be executed by such an apparatus.

The implementation may be in hardware or in software or may be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. A data carrier may be provided which has electronically readable control signals, which are capable of cooperating with a programmable computer system, such that the method described herein is performed.

The implementation may also be in the form of a computer program product with a program code, the program code being operative for performing the method when the computer program product runs on a computer. The program code may be stored on a machine readable carrier.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

The invention claimed is:

1. A control circuit for controlling an operation of a power amplifier core switchable between an envelope tracking operation mode and a non-envelope tracking operation mode, wherein the control circuit is configured to at least one of provide a control signal for controlling the operation of the power amplifier core, and process an amplified signal received from the power amplifier core based on the operation mode of the power amplifier core, wherein the control circuit comprises at least one of the following:

a switchable match circuit comprising an input configured to couple to an output of the power amplifier core, receive the amplified signal from the power amplifier core, wherein the switchable match circuit is configured to provide for the amplified signal a first load impedance in response to the envelope tracking operation mode and a second load impedance, different from the first load impedance, in response to the non-envelope tracking operation mode;

a switchable bias circuit comprising a bias output configured to couple to a control input of the power amplifier core, wherein the switchable bias circuit is configured to provide at the bias output a first bias signal in response to the envelope tracking operation mode and a second bias signal, different from the first bias signal, in response to the non-envelope tracking operation mode; and a switchable supply circuit comprising a power amplifier supply terminal configured to couple to a supply input of the power amplifier core, wherein the switchable supply circuit is configured to provide at the power amplifier supply terminal a first decoupling capacitance for decoupling an envelope tracking supply signal received from a DCDC converter in response to the envelope tracking operation mode, and provide a second decoupling capacitance, different from the first decoupling capacitance, for decoupling a non-envelope tracking supply signal received from the DCDC converter in response to the non-envelope tracking operation mode.

2. The control circuit according to claim 1, wherein the first load impedance is greater than the second load impedance.

3. The control circuit according to claim 1, wherein the first load impedance is configured to increase a peak efficiency of the power amplifier core in the envelope tracking operation mode.

4. The control circuit according to claim 1, wherein the DCDC converter is configured to operate in a buck mode in response to the non-envelope tracking operation mode; and
wherein the second load impedance is configured to increase a maximum power output of the power amplifier core in the non-envelope tracking operation mode.

5. The control circuit according to claim 1, wherein the first bias signal is configured to increase a quiescent current of the power amplifier core in the envelope tracking operation mode.

6. The control circuit according to claim 1, wherein the second bias signal is configured to reduce a quiescent current of the power amplifier core in the non-envelope tracking operation mode.

7. The control circuit according to claim 1, wherein the first decoupling capacitance is smaller than the second decoupling capacitance.

8. The control circuit according to claim 1, wherein the switchable supply circuit comprises a capacitor terminal configured to couple to at least one decoupling capacitor, wherein the switchable supply circuit is configured to couple the power amplifier supply terminal to the capacitor terminal in response to the non-envelope tracking operation mode and to decouple the power amplifier supply terminal from the capacitor terminal in response to the envelope tracking operation mode.

9. A power amplifier switchable between an envelope tracking operation mode and a non-envelope tracking operation mode, the power amplifier comprising:
a RF input;
a RF output;
a power amplifier core coupled between the RF input and the RF output; and
a switchable match circuit configured to provide for the power amplifier core a first load impedance in response to the envelope tracking operation mode and a second load impedance, different from the first load impedance, in response to the non-envelope tracking operation mode.

10. The power amplifier according to claim 9, wherein the first load impedance is greater than the second load impedance.

11. The power amplifier according to claim 9, further comprising a switchable bias circuit configured to provide for the power amplifier core a first bias signal in response to the envelope tracking operation mode and a second bias signal, different from the first bias signal, in response to the non-envelope tracking operation mode.

12. The power amplifier according to claim 11, wherein the first bias signal is configured to set a quiescent current of the power amplifier core to a first strength, and wherein the second bias signal is configured to set the quiescent current of the power amplifier core to a second strength, smaller than the first strength.

13. The power amplifier according to claim 9, further comprising a switchable supply circuit configured to provide for the power amplifier an envelope tracking supply voltage received from a DCDC converter in response to the envelope tracking operation mode, and provide a non-envelope tracking supply voltage received from the DCDC converter in response to the non-envelope tracking operation mode;
wherein the switchable supply circuit is further configured to provide a first decoupling capacitance for decoupling the envelope tracking supply voltage in response to the envelope tracking operation mode, and provide a second decoupling capacitance, different from the first decoupling capacitance, for decoupling the non-envelope tracking supply voltage in response to the non-envelope tracking operation mode.

14. The power amplifier according to claim 13, wherein the first decoupling capacitance is smaller than the second decoupling capacitance.

15. The power amplifier according to claim 13, wherein the switchable supply circuit comprises a power amplifier supply terminal configured to provide the envelope tracking supply voltage and the non-envelope tracking supply voltage received from the DCDC converter and a capacitor terminal configured to be coupled to at least one decoupling capacitor, wherein the switchable supply circuit is configured to couple the power amplifier supply terminal to the capacitor terminal in response to the non-envelope tracking operation mode, and decouple the power amplifier supply terminal from the capacitor terminal in response to the envelope tracking operation mode.

16. An amplifier circuit switchable between an envelope tracking operation mode and a non-envelope tracking operation mode, the amplifier circuit comprising:
a power amplifier, comprising:
a RF input;
a RF output; and
a power amplifier core coupled between the RF input and the RF output;
and
a switchable match circuit configured to provide for the power amplifier core a first load impedance in response to the envelope tracking operation mode and a second load impedance, different from the first load impedance, in response to the non-envelope tracking operation mode; and
a DCDC converter configured to provide for the power amplifier an envelope tracking supply voltage in response to the envelope tracking operation mode and a non-envelope tracking supply voltage in response to the non-envelope tracking operation mode.

17. The amplifier circuit according to claim 16, wherein the DCDC converter is configured to operate in a buck mode in response to the non-envelope tracking operation mode.

18. The amplifier circuit according to claim 16, wherein the power amplifier further comprises a switchable bias circuit configured to provide for the power amplifier core a first bias signal in response to the envelope tracking operation mode and a second bias signal in response to the non-envelope tracking operation mode, wherein the first bias signal is configured to set a quiescent current of the power amplifier core to a first strength, and wherein the second bias signal is configured to accept the quiescent current of the power amplifier core to a second strength, smaller than the first strength.

19. The amplifier circuit according to claim 16, wherein the amplifier circuit further comprises at least one decoupling capacitor; and
wherein the power amplifier comprises a switchable supply circuit comprising a power amplifier supply terminal coupled to the DCDC converter and a capacitor terminal coupled to the at least one decoupling capacitor, wherein the switchable supply circuit is configured to couple the power amplifier supply terminal to the capacitor terminal in response to the non-envelope tracking operation mode and to decouple the power amplifier supply terminal from the capacitor terminal in response to the envelope tracking operation mode.

20. A mobile communication device, comprising:
an RF circuit configured to provide or receive RF signals; and
an antenna port coupled to the RF circuit;
wherein the RF circuit comprises a power amplifier switchable between an envelope tracking operation mode and a non-envelope tracking operation mode, the power amplifier comprising:
a RF input;
a RF output; and
a power amplifier core coupled between the RF input and the RF output;
and
a switchable match circuit configured to provide for the power amplifier core a first load impedance in response to the envelope tracking operation mode and a second load impedance, different from the first load impedance, in response to the non-envelope tracking operation mode.

21. A method for controlling an operation of a power amplifier switchable between an envelope tracking operation mode and a non-envelope tracking operation mode, the method comprising:
providing a control signal for controlling the operation of the power amplifier based on the operation mode of the power amplifier; or
processing an amplified signal received from the power amplifier in dependence on the operation mode of the power amplifier.

22. The method of claim 21, wherein providing the control signal comprises controlling a switchable match circuit with the control signal to provide the power amplifier a first load impedance if the control signal indicates the envelope tracking operation mode, and provide a second, different load impedance if the control signal indicates the non-envelope tracking operation mode.

23. The method of claim 21, wherein providing the control signal comprises controlling a switchable bias circuit with the control signal to provide a first bias signal to the power amplifier if the control signal indicates the envelope tracking operation mode, and provide a second, different bias signal if the control signal indicates the non-envelope tracking operation mode.

24. The method of claim 21, wherein providing the control signal comprises controlling a switchable supply circuit with the control signal to provide the power amplifier a first decoupling capacitance for decoupling an envelope tracking supply signal received from a DCDC converter if the control signal indicates the envelope tracking operation mode, and provide a second, different decoupling capacitance for decoupling a non-envelope tracking supply signal received from the DCDC converter if the control signal indicates the non-envelope tracking operation mode.

* * * * *